United States Patent [19]
Sapru et al.

[11] Patent Number: 5,562,776
[45] Date of Patent: Oct. 8, 1996

[54] APPARATUS FOR MICROWAVE PLASMA ENHANCED PHYSICAL/CHEMICAL VAPOR DEPOSITION

[75] Inventors: Krishna Sapru, Troy; Annette J. Krisko, Highland; David Beglau, Oxford; Benjamin S. Chao, Troy, all of Mich.

[73] Assignee: Energy Conversion Devices, Inc., Troy, Mich.

[21] Appl. No.: 308,861

[22] Filed: Sep. 19, 1994

[51] Int. Cl.$^6$ .............................. A01K 15/04; H05H 1/30
[52] U.S. Cl. ............ 118/723 VE; 118/50; 118/723 MW; 427/250; 427/255.2; 427/294; 427/576; 427/585; 427/595
[58] Field of Search .......................... 118/719, 723 VE, 118/723 MW, 723 ME, 50.1, 50; 427/575, 576, 585, 595, 250, 255.2, 294

*Primary Examiner*—Bernard Pianalto
*Attorney, Agent, or Firm*—David W. Schumaker; Marvin S. Siskind; Marc J. Luddy

[57] ABSTRACT

A microwave plasma enhanced PVD/CVD apparatus and method. The apparatus includes an evacuable deposition chamber having a plasma region and a deposition region adjacent one another. The apparatus also includes a source of microwave energy, and a microwave waveguide to transfer microwave energy from the source thereof to the plasma region. Additionally, the apparatus includes a plate, crucible or boat for holding solid or liquid starting materials within said plasma region, and a system of flow controllers and gas transport tubing for introducing gaseous materials into the plasma region, the interaction of the microwave energy with the gaseous materials forms a plasma within the plasma region. The plasma provides thermal energy for the evaporation of the solid or liquid starting materials and causes the reaction of any reactive gases or vapors present in the plasma region. A substrate holder is positioned within the deposition region for holding a substrate upon which the deposited material is collected and a system of pumps, valves and exhaust tubing is attached to the deposition chamber for evacuating the deposition chamber and venting undeposited waste gases and vapors. The method involves the steps of providing an evacuable deposition chamber having a plasma region and a deposition region adjacent one another; positioning a substrate within the deposition region; providing solid or liquid starting materials within the plasma region; evacuating the deposition chamber; providing a source of microwave energy; transferring microwave energy from the source thereof to the plasma region; introducing gaseous materials into the plasma region; interacting the microwave energy with the gaseous materials to form a plasma within the plasma region, the plasma providing thermal energy for the evaporation of the solid or liquid starting materials and causing the reaction of any reactive gases or vapors present in the plasma region; depositing the evaporated and reacted species upon the substrate to form a thin film of deposited material; and venting undeposited waste gases and vapors from the deposition chamber.

12 Claims, 2 Drawing Sheets

APPARATUS FOR MICROWAVE PLASMA ENHANCED PHYSICAL/CHEMICAL VAPOR DEPOSITION

FIELD OF THE INVENTION

The present invention relates to an apparatus and method for the combined physical and chemical vapor deposition of thin-film material. More specifically, the invention relates to an apparatus for microwave plasma enhanced physical/chemical vapor deposition of thin films from solid or liquid starting materials using inert gas to form a plasma within the evaporation region. Gaseous starting materials also may be used in conjunction with the solid starting materials when additional species to be incorporated into the chemical vapor deposition is desired.

BACKGROUND OF THE INVENTION

Thermoelectric materials have been known for many decades now. Early work by F. D. Rosi and others has shown that the pseudobinary system $Bi_2Te_3$-$Sb_2Te_3$ and the pseudoternary system $Bi_2Te_3$-$Sb_2$-$Te_3Sb_2Se_3$ are useful materials for thermoelectric applications. See W. M. Yin, et al, "Thermoelectric Properties of $Bi_2Te_3$-$Sb_2Te_3Sb_2Se_3$ Pseudo-Ternary Alloys in the Temperature Range of 77° to 300° K", Journal of Material Science 1 (1966) 52–65. However, the fabrication methods of the prior art have been limited to small areas. Typically these materials have been produced by melting and casting ingots which are then cut into devices or by powder metallurgical techniques. These prior art process are not readily scaled to large area and are limited in their starting materials.

Other processes such as evaporation or chemical vapor deposition (CVD), which are scaled to large area depositions have their own problems. For example, CVD cannot use solid materials but must use gaseous or liquid starting material compounds, which are then broken down by thermal or plasma energy. Typically, the deposited materials in a CVD contain unwanted elements which are incorporated from incompletely reacted starting gases and it is often difficult or impossible to eliminate these contaminants. Evaporation on the other hand can use solid or liquid starting materials, but cannot induce the chemical reactivity and depositing species mobility often needed to achieve the final material properties desired. Therefore, these processes are plagued by an inability to modify or tailor the as deposited composition.

While the method and apparatus of the instant invention is applicable to any material system where it is desirous to deposit large area materials from diverse reactants, one particular type of system is thin-film thermoelectric materials.

The world supply of fossil fuel for the production of energy is being exhausted at an ever increasing rate. This as resulted in a continuing energy and economic crises which impacts not only on the world's economy but on peace and stability. Solutions to the energy crisis include the development of new fuels and the development of more efficient technologies to utilize existing fuels. One method of more efficiently utilizing existing fuels, including energy conservation, power generation, environmental protection, and economic growth, is the thermoelectric generation of electricity.

In the thermoelectric generation of electricity electrical power is generated by heat. It has been estimated that two-thirds of all energy, for example from automobile exhausts, fossil fuel, power plants, and the like, is discharged to the environment without further recovery. This so-called waste heat is paid for and then discharged into the environment without use. Employment of waste heat for the generation of electricity can provide a direct reduction in thermal pollution and an increase in economically efficient utilization of fuels, independent of the original source of the thermal energy.

New, improved, low cost thermoelectric materials and devices will allow for: 1) Reliable, environmentally sound non-CFC cooling systems with no moving parts; 2) low weight power generation devices; 3) low weight cooling/heating devices; 4) waste heat utilization; 5) the ability to provide localized cooling/heating, or power in remote areas; 6) non-dependence on fossil fuels; and 7) battery/solar powered military equipment for personnel comfort devices and hostile environments. Reductions in weight, cost, and improvements in efficiency of the active materials will generate a rapid increase in the utilization of thermoelectric modules for consumer products, military/aerospace, industrial and scientific applications. A very attractive way for obtaining lightweight, low cost thermoelectric modules is to develop a suitable technique for depositing the active materials over large areas on substrates in the form of thick/thin films.

The performance of a thermoelectric device can be expressed in terms of a figure of merit (Z) for the material forming the device. Z is defined by the relationship:

$$Z = S^2 K^{-1} \sigma$$

where

Z is the Figure-of-Merit

S is the Seebeck coefficient

K is the thermal conductivity, and $\sigma$ is the electrical conductivity.

In order for a material to be suitable for thermoelectric power generation, the thermoelectric power coefficient, that is the Seebeck coefficient, S., must be high, the electrical conductivity, sigma, must be high, and the thermal conductivity, K, must be low. For glassy materials K is low.

Therefore, in order for material to be efficient for thermoelectric power conversion, charge carriers must diffuse easily from the hot junction to the cold junction while maintaining a temperature gradient between the two junctions. Thus high electrical conductivity is required along with low thermal conductivity.

Historically, thermoelectric power conversion has not found wide commercial usage. The major reason for this has been that thermoelectric materials which were suitable for commercial applications have been crystalline. Those crystalline materials which are best suited for thermoelectric devices have been difficult to manufacture because of poor mechanical properties and extreme sensitivity of material properties to macroscopic compositional changes. This is because prior art crystalline thermoelectric materials contain a predominance of chalcogenide elements, tellurium and selenium. Tellurium and selenium are natural glass formers. It is because of this tendency of tellurium and selenium to form glasses that the growth, control, and mechanical stability of prior art thermoelectric crystalline materials has been substantially nonreproducible. In addition, the thermoconductivity of glasses are low.

The chalcogenides, such as tellurium, only grow high quality, single crystals with great difficulty. Even when tellurium containing single crystals are gown, the crystalline materials are unstable materials with large defect densities, and compositions far from stoichiometric. For these reasons, controlled doping has proven to be extremely difficult.

Moreover, crystalline solids have been unable to attain large values of electrical conductivity while simultaneously retaining low thermal conductivity.

Conventional polycrystalline thermoelectric materials are $(BiSb)_2$ $(SeTe)_3$ Pb Te, and Si—Ge. The bismuth-antimony tellurides represent a continuous solid system in which the relative amount of bismuth and antimony are from 0 to 100%. Polycrystalline materials also present problems in that the polycrystalline materials have polycrystalline grain boundaries, resulting in relatively low electrical conductivities. Moreover, fabrication of polycrystalline thermoelectric materials into suitable thermoelectric devices have presented difficulties, such as the inability to make lare area, high quality devices devices and the mechanical integrity of the devices during operation.

Improved thermoelectric materials have been developed which are not single phase crystalline materials, but are instead, disordered materials. These materials, more fully disclosed in U.S. Pat. No. 4,447,277 in the names of T. J. Jayadev and On Van Nguyen for "New Multiphase Thermoelectric Alloys and Methods of Making the Same", issued May 8, 1984, incorporated herein by reference. The materials of Jayadev and Nguyen are multiphase materials having both amorphous and multiple crystalline phases. These materials are good thermal insulators, and include grain boundaries of various transitional phases varying in composition from the composition of matrix crystallites to the composition of the various phases in the grain boundary region. The grain boundaries are highly disordered with the transitional phases including phases of high thermal resistivity to provide high resistance to thermal conduction. The materials of Jayadev and Nguyen have grain boundaries defining regions which include conductive phases therein, providing numerous electrical conduction paths through the bulk material for increasing electrical conductivity without substantially affecting thermal conductivity. In essence, the materials have all the advantages of polycrystalline material, with desirably low conductivities and crystalline bulk Seebeck properties. Moreover, the disordered multiphase materials also have high electrical conductivity. Thus the materials of Jayadev and Nguyen have an $S^2$ (sigma) product for the figure of merit which can be independently maximized with desirably low thermal conductivities for thermoelectric power generation.

The materials of Jayadev and Nguyen are fabricated in a manner which introduces disorder into the material on a macroscopic level. This disorder allows various phases, including conductive phases, to be introduced into the materials.

U.S. Pat. No. 4,588,520 by T. J. Jayadev, On Van Nguyen, Jaime M. Reyes, H. Davis, and M. W. Putty, (hereinafter "Jayadev et al"), incorporated herein by reference, describes compacted an/or compressed powder materials useful for thermoelectric applications. The powdered materials have compositional disorder, translational disorder, configurational disorder, and other disorders introduced therein. The powder materials are multiphase alloy materials having a first phase, including matrix crystallites bounded by disordered grain boundaries at various phases including transitional phases. Between the grain boundaries are macroscopic grain boundary regions which also include various phases, including electrically conductive phases and crystalline inclusions. The grain boundary regions are rich in electrically conducting modifying phases which provide high electrical conductivities. The other phases in the grain boundary regions and the grain boundaries provide low thermal conductivities.

The compacted materials further include additional bulk disorder between the interfaces of the compacted powder particles which further reduce thermal conductivity. The materials comprise a body formed from compacted powder material. The compacted powder material includes bismuth, tellurium, and a t least one highly electrically conductive phase.

The materials described in Jayadev et al are made by forming a mixture containing the constituent elements of a first compound including at least bismuth and tellurium and constituent elements of a second compound capable of forming at least one highly electrically conductive phase, and thereafter compressing at least a portion of the particulate mixture to form a compacted body of the material. The first and second compounds may be separately prepared from the respective constituent elements, and then the first and second compounds combined and heated to form a melt, with the melt cooled to form a solid material form which is crushed to form the particulate materials.

Alternately, a melt may be formed from the second compound and the constituent elements of the first compound and then cooled, for example by planar flow casting, to a solid material form and crushed to form the particulate mixture. According to further alternative, the first and second compounds, that is the bismuth and tellurium compound, and the compound capable of forming at least one highly electrically conductive phase, may be separately prepared from their respective constituent elements and separately crushed into particulate form to form the particulate mixture.

The first compound includes bismuth, antimony, and tellurium for making a p-type material and bismuth, tellurium, and selenium for making an n-type material. The second compound, to be combined with either of the first compounds, that is, with either the p-type material or the n-type material, includes silver, antimony, and tellurium.

Individual thermoelectric elements of the n-type drive negative carders from the hot side of the device to the cold side of the device, while individual thermoelectric elements of the p-type conductivity drive positive carders from the hot side of the device to the cold side of the device. Operative thermoelectric devices are characterized by a plurality of thermoelectric elements, thermally in parallel and electrically in series. N-type elements an p-type elements of the thermoelectric device are assembled so that they are thermally in parallel and electrically in series with one another. Each pair of elements contain one n-type thermoelectric element and one p-type thermoelectric element electrically connected at one end by an electrical connecting strap. Each strap connects the end of an n-type element of each pair of electrically connected thermoelectric elements to the p-type element of the next adjacent pair of electrically connected thermoelectric elements. Thus, all of the individual n-type and p-type thermoelectric elements of a thermoelectric device are connected electrically in series and thermally in parallel. In order to achieve maximum power output for a thermoelectric device, the electrical resistance of both the individual strap and of the thermoelectric device to strap contact must be minimized.

While the thermoelectric materials have been known and used for many years, to date there has been little investigation into production of apparatus to deposit large area, uniform thermoelectric materials. The present invention discloses a microwave enhanced plasma deposition apparatus and method for fabricating unique thin/thick-film compositions at relatively low cost from diverse starting materials which include solid or liquid sources. The apparatus combines both physical vapor deposition (PVD) with chemical vapor deposition (CVD) and can accommodate simultaneous use of solid/liquid starting materials with gaseous starting materials. The process allows for control of the morphology, chemistry and composition of the as-deposited materials to obtain the desired material properties.

SUMMARY OF THE INVENTION

The instant application discloses a microwave plasma enhanced PVD/CVD apparatus and method. The apparatus includes an evacuable deposition chamber having an evaporation/reaction plasma region and a deposition region adjacent one another. The apparatus also includes a source of microwave energy, a microwave waveguide to transfer microwave energy from the source thereof to the evaporation/reaction plasma region. Additionally, the apparatus includes a plate, crucible or boat for holding solid or liquid starting materials within said evaporation/reaction plasma region, and a system of flow controllers and gas transport tubing for introducing gaseous materials into the evaporation/reaction plasma region, the interaction of the microwave energy with the gaseous materials forming a plasma within the evaporation/reaction region. The plasma providing thermal energy for the evaporation of the solid or liquid starting materials and causing the reaction of any reactive gases or vapors present in the plasma region. A substrate or holder is positioned within the deposition region for holding a substrate upon which the deposited material is collected and a system of pumps, valves and exhaust tubing is attached to the deposition chamber for evacuating the deposition chamber and venting undeposited waste gases and vapors.

The method involves the steps of providing an evacuable deposition chamber having a plasma region and a deposition region adjacent one another, positioning a substrate within the deposition region; providing solid or liquid starting materials within the plasma region; evacuating the deposition chamber; providing a source of microwave energy; transferring microwave energy from the source thereof to the plasma region; introducing gaseous materials into the plasma region; interacting the microwave energy with the gaseous materials to form a plasma within the plasma region, the plasma providing thermal energy for the evaporation of the solid or liquid starting materials and causing the reaction of any reactive gases or vapors present in the plasma region; depositing the evaporated and reacted species upon the substrate to form a thin or thick film of deposited material; and venting undeposited waste gases and vapors from the deposition chamber.

DETAILED DESCRIPTION OF THE INVENTION

Figure 1:
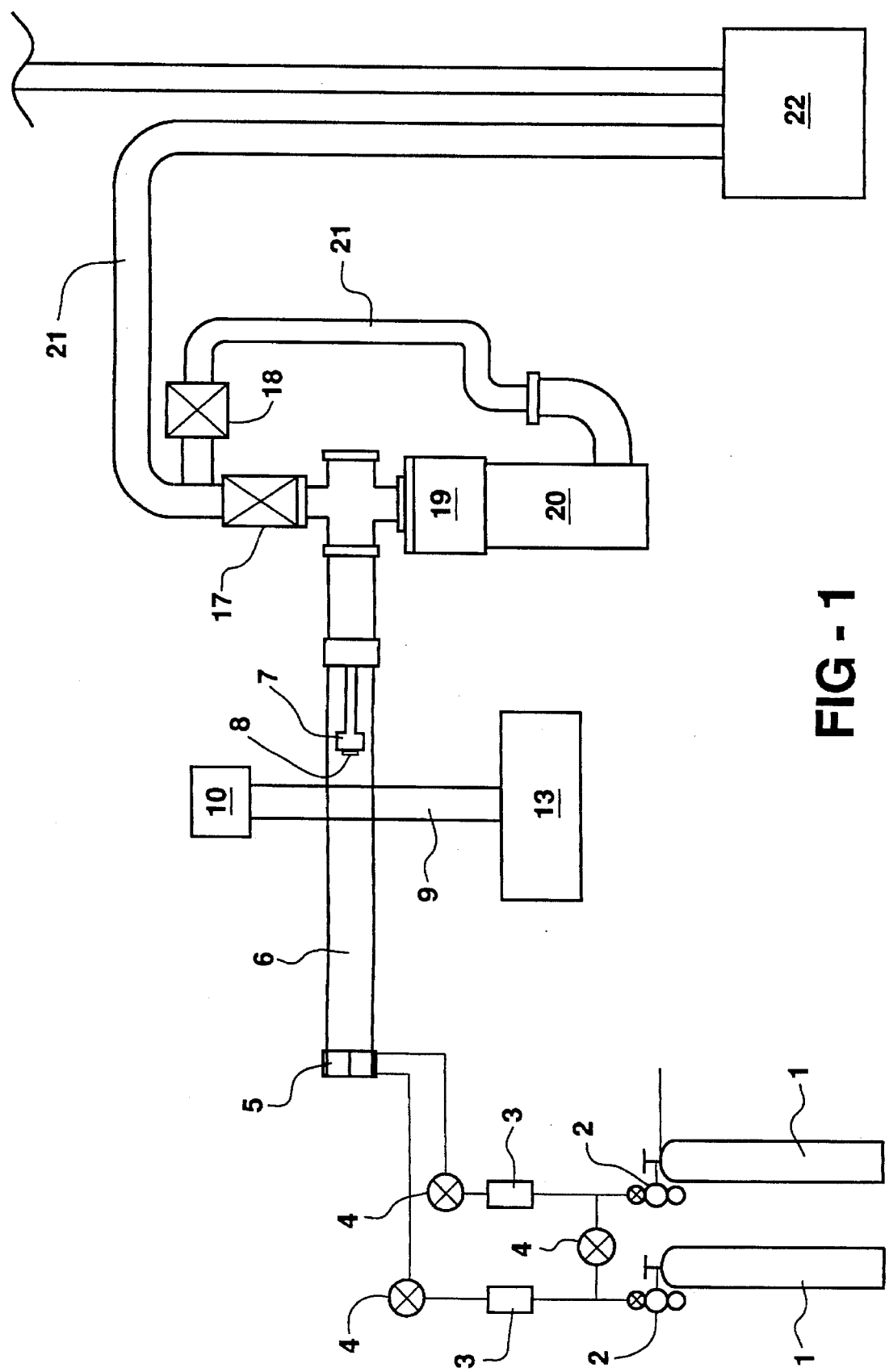
FIG. 1 is a schematic depiction not to scale of the microwave plasma enhanced physical/chemical vapor deposition apparatus of the present invention.

FIG. 1 is a schematic of the system of the plasma enhanced physical/chemical vapor deposition system of the instant invention. It should be noted that while the apparatus was originally built to deposit Te:Se:Bi:Sb-based thermoelectric films at high deposition rate by using microwave plasma enhanced physical vapor deposition, other solid starting materials may be deposited by the present system and also, reactive gases may be introduced into the deposition chamber thereby allowing for both chemical and physical vapor deposition simultaneously.

Figure 2:
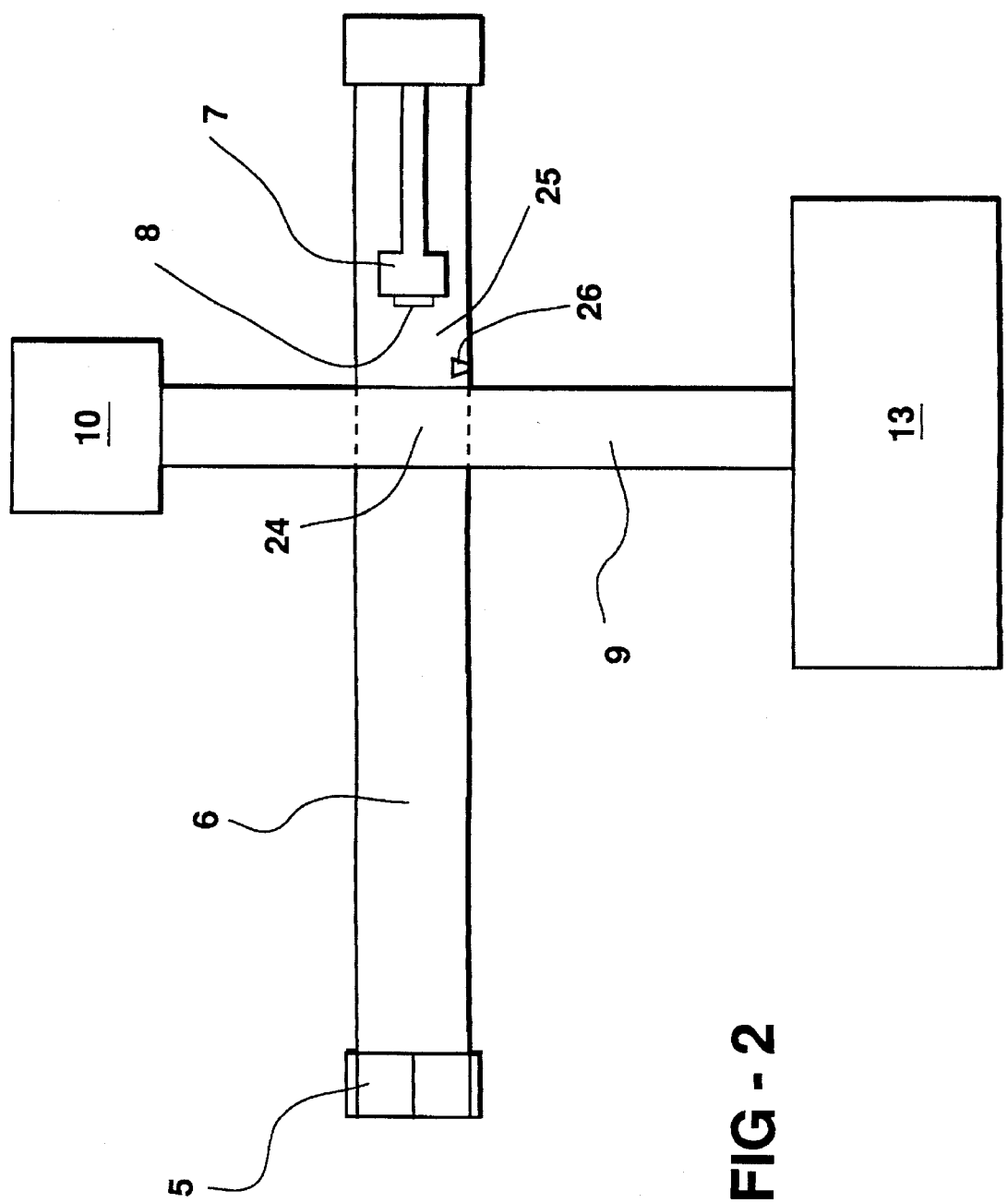
FIG. 2 is an enlarged view of the deposition chamber portion of the microwave plasma enhanced physical/chemical vapor deposition apparatus of the instant invention depicting additional features which are not indicated in FIG. 1.

Returning now to a description of the apparatus of the instant invention, the apparatus includes an evacuable reaction chamber 6. Preferably the reaction chamber 6 is formed from a quartz tube, which allows easy monitoring of film accumulation. Within the reaction chamber 6, are an evaporation/reaction region (see reference 24 of FIG. 2) and a deposition region (see reference 25 of FIG. 2). These regions are adjacent one another and may be somewhat overlapping. A substrate holder 7 is placed with the deposition region 25 upon which a substrate 8 is placed.

The heat generated by the plasma in the evaporation/reaction region 24 increased the substrate temperature to about 100° C. within 60 minutes. A first substrate holder was designed to provide additional external heating to allow for higher temperatures of deposition. It also allowed for annealing of deposited films in-situ, at various temperatures without having to expose the film air. A temperature controller using the thermocouple signal controlled the substrate temperature within ±2° C. This substrate holder was used to experiment in the temperature range of 100°–350° C.

For temperatures below 100° C., a water cooled substrate holder was used. This flexibility in substrate temperature was used to allow for differences in the sticking coefficients of various elements and alloys at different temperatures, and in order to generate films having different morphological features. Additionally, it is useful to be able to adjust the distance between the evaporation/reaction region 2 and the substrate holder 8. This adjustability allows for optimization of the deposited film composition.

Non-reactive plasma forming gases, such as argon or helium, flow in gas transport tubing 26 from a source 1 through flow regulators 2, mass flow controllers 3 and valves 4. The gas enters the quartz tube 6 through end cap 5 and is converted to a plasma when encountering microwaves in the evaporation/reaction region 24. The microwaves are created by the microwave power supply 13. The generated microwaves propagate through waveguide 9 and radiate out of a hole through which the quartz tube reaction chamber 6 is inserted. The microwaves are typically generated at a frequency of 2.54 GHz, but in reality, any frequency may be used. The power of the microwave energy can be varied as required to accommodate different starting materials.

The interaction of the microwaves and the gases in the deposition chamber form a plasma. This plasma aids in evaporation of the solid precursors present in the starting material holder (see reference 26 in FIG. 2). This holder can be anything which will contain the solid or liquid starting material and be non-reactive in the plasma environment. The holder typically will be a plate, crucible or boat. In addition to the heat generated by the plasma, the starting materials can also be heated by a separate thermal generator (not shown). This additional heat can serve two purposes, first, to add thermal to the staffing material and second, to prevent unwanted deposition on the chamber walls by increasing the temperature thereof.

Again, while the invention is presently being described with respect to solids as the starting materials, the system is designed such that the reactants (starting materials) for film deposition can be either solids, liquids, gases, or a combination, as desired. Solids and liquids can be placed in the plasma zone and heated to evaporate them. Liquids or melted solids can be introduced as vapors carded entrained by gases (reactive and/or inert) which are bubbled through the liquid. Gases (reactive and/or inert) can be introduced from compressed gas cylinders 1 via mass flow controllers 3. Typically, the gas used to produce the plasma is an inert gas such as helium or argon. When a reactive gas is introduced into the chamber, it interacts with the microwave plasma (chemical vapor deposition) and at least a portion of the starting gas deposits onto the substrate 8.

The deposition chamber 6 must be evacuated to form the microwave plasma. This is accomplished by using the diffusion pump 20, its associated gate valve 19, a mechanical pump 22, its associated roughing valve 17, and the foreline valve 18. In addition to evacuating the deposition chamber, this system of pumps also removes all gaseous waste products. These may include inert gases, evaporated starting materials, reaction byproducts, etc.

Elemental and alloy films have been successfully deposited onto metal, silicon and glass substrates. One can see from Table 1 that films as thick as 50 m and deposition rates as high as 140 Å/sec have been achieved using the microwave plasma enhanced CVD/PVD apparatus of the present invention. These thicknesses and rates can lead to low cost production of large area thermoelectric devices using large area uniform microwave plasma generation designs. The film compositions presented in Table 1 were measured by EDS and auger analysis.

The deposition parameters used may vary widely depending upon such considerations as the materials to be deposited, the starting materials and the desired composition of the deposited film. The following describes the deposition parameters used to deposit the films described in Table 1. Argon gas (99.999% purity) was used as an inert plasma forming gas and was introduced at a flow rate of approximately 60 sccm. The deposition chamber pressure was about 30 mTorr. A microwave power of approximately 200 watts at a frequency of 2.54 GHz was used to deposit the films. Deposition typical lasted about 60 minutes. Solid sources of Te, Se, Bi, Sb elements, $Bi_2Te_e Bi_2Se_3 Sb_2Se_3$, binaries and alloy 3276-1 ($Bi_2Te_3+Sb_2Te_3+Sb_2Se_3$) can be used. Substrate temperature was varied from about 100° C. to about 300° C. and quartz tube temperature (heat tape or a band heater can be placed around the tube in the vicinity of the solid or liquid starting material for use as an additional thermal source as described hereinabove) ranged from about 100° C. to about 465° C. Copper and stainless steel substrates were used concurrently with crystalline Si and 7059 glass, for EDS analysis and conductivity measurements, respectively.

The effect of the microwave plasma was investigated in the case of Sb. Run #25 was performed without adding microwave power to generate a plasma. The deposition rate was compared to similar runs (#19, 20, 23, 24, 26) made using the plasma. It can clearly be seen that the observed deposition rate when a plasma was used was higher than when the plasma was not used. This indicates that, at least for the materials investigated to date, film deposition is not simply an evaporation process. The microwave plasma undoubtedly plays an important role in enhancing the deposition rate of the depositing species. The microwave plasma seems to have additional effects upon the film characteristics. These effects include: 1) increases the electrical conductivity of the films, 2) increases the Seebeck coefficient of the films, 3) improved reproducibility of the films characteristics, 4) effects the morphology of the deposited film. Films made without the plasma have poor reproducibility and typically lack uniformity; visible apparent light and dark areas being seen on the same sample. The morphology and composition are quite different in the light and dark areas.

One deposited thin-film with very good thermoelectric properties was a 2 micron thick $Bi_2Te_3$ film deposited from crushed $Bi_2Te_3$. The deposition time was about 2 hours, the gas flow as 40 SCCM argon, the microwave power was about 200 watts and a quartz tube temperature of about 400° C. was reached. This film exhibited a thermoelectric Figure-of-Merit (Z) of about $4.3 \times 10^{-4}$/° K.

It is to be understood that the disclosure set forth herein is presented in the form of detailed embodiments described for the purpose of making a full and complete disclosure of the present invention as set forth and defined in the appended claims.

TABLE 1

| SAMPLE | SOURCE | FILM COMPOSITION (at. %) | FINAL QUARTZ TUBE TEMP. (°C.) | FINAL SUBSTRATE TEMP. (°C.) | THICKNESS (μM) |
|---|---|---|---|---|---|
| TE004 | Alloy 3276-1 | Te60Sb1.3Bi1.3O24C8Fe5 | 316 | 142 | 0.03 |
| TE010 | Alloy 3276-1 | Te97.7Sb1.8B10.6 | 377 | 163 | 0.4 |
| TE011 | Alloy 3276-1 | Te100 | 380 | 177 | 1.4 |
| TE012 | 50% Bi2Se3, 50% 3276-1 | Te63.1Se36.9 | 460 | 144 | 2.6 |
| TE014 | 50% Bi2Se3, 50% 3276-1 | — | 465 | 300 | No film |
| TE015 | 50% Bi2Se3, 50% 3276-1 | Te93Sb3Se4 | 439 | 127 | .04 |
| TE016 | Te | Te100 | 438 | 128 | 35 |
| TE017 | Se | Te1.5Se98.5* | 423 | 164 | Not continuous |
| TE018 | Bi | Te14.6Se85.4* | 416 | 146 | 17 |
| TE019 | Sb | Te9.4Se84.9Sb5.7* | 418 | 108 | 0.32 |
| TE020 | Sb | Te10.4Se89.6* | 412 | 95 | 4.3 |
| TE021 | Bi | Te22.3Se77.7* | 403 | 138 | 50 |
| TE023 | Sb | — | 457 | 151 | 17.3 |
| TE024 | Sb | — | 452 | 150 | 3 |
| TE025 | Sb | — | 420 | 149 | 0.03 |
| TE026 | Sb | — | 455 | 156 | 0.5 |
| TE027 | Sb2Te3 | Te54.4Se41.7Sb4.0* | 450 | 172 | 4.6 |
| TE028 | Bi2Te3 | Te77.4Se20.0Sb2.7* | 451 | 167 | 1.3 |
| TE030 | Bi2Se3 | Te57.1Se40.0Sb2.9* | 452 | 161 | 0.5 |
| TE031 | Sb2Se3 | Te56.7Se38.1Sb5.2* | 452 | 159 | 0.3 |

TABLE 1-continued

| SAMPLE | SOURCE | FILM COMPOSITION (at. %) | FINAL QUARTZ TUBE TEMP. (°C.) | FINAL SUBSTRATE TEMP. (°C.) | THICKNESS (μM) |
|---|---|---|---|---|---|
| TE032 | Bi2Te3 | Te94.0Se6.0* | 412 | 108 | 3.0 |
| TE033 | Bi2Te3 | Te89.2Se5.4Sb5.4 | 430 | 129 | 0.1 |
| TE036 | Bi2Te3 | Te59Bi41 | 476 | 134 | downstream of substrate |

*Unintentional inclusions from previous runs

We claim:

1. A microwave plasma enhanced PVD/CVD apparatus, said apparatus including:
   an evacuable deposition chamber, said deposition chamber having an evaporation/reaction plasma region and a deposition region adjacent one another;
   a source of microwave energy;
   means to transfer microwave energy from said source thereof to said evaporation/reaction plasma region;
   means for holding solid or liquid starting materials within said evaporation/reaction plasma region;
   means for introducing gaseous materials into said evaporation/reaction plasma region, the interaction of said microwave energy with said gaseous materials forming a plasma within said evaporation/reaction plasma region, said plasma providing thermal energy for the evaporation of said solid or liquid starting materials and causing the reaction of any reactive gases or vapors present in the plasma region;
   a substrate holder is positioned within said deposition region for holding a substrate upon which the deposited material is collected; and
   means for evacuating the deposition chamber and venting undeposited waste gases and vapors connected to said deposition chamber.

2. A deposition apparatus as in claim 1, wherein said deposition chamber is formed from a quartz tube.

3. A deposition apparatus as in claim 1, wherein said source of microwave energy is a source of 2.54 GHz microwaves of variable power.

4. A deposition apparatus as in claim 1, wherein said means to transfer microwave energy from said source thereof to said evaporation/reaction plasma region comprises a microwave waveguide.

5. A deposition apparatus as in claim 1, wherein said means for holding solid or liquid starting materials within said evaporation/reaction plasma region comprises a plate, crucible or boat.

6. A deposition apparatus as in claim 1, wherein said means for introducing gaseous or liquid materials into said evaporation/reaction plasma region includes a source of said gaseous materials and means for the controlled transport of said gaseous materials to said plasma region.

7. A deposition apparatus as in claim 6, wherein said means for the controlled transport of said gaseous or liquid materials to said plasma region includes flow regulators, flow meters, flow control valves and interconnecting gas transport tubing positioned between said source of gaseous material and said deposition chamber.

8. A deposition apparatus as in claim 6, wherein said source of said gaseous materials includes a source of an inert plasma forming gas.

9. A deposition apparatus as in claim 8, wherein said source of said gaseous materials further includes a source of reactive gas, said reactive gas reacting in said plasma region and at least a portion thereof depositing onto the substrate in said deposition region.

10. A deposition apparatus as in claim 8, wherein said inert plasma forming gas is helium or argon.

11. A deposition apparatus as in claim 1, wherein the position of said substrate holder within said deposition region is adjustable, thereby providing the ability to adjust the composition of the depositing materials.

12. A deposition apparatus as in claim 1, further including a thermal energy source positioned in proximity to both said means for holding solid or liquid starting materials within said plasma region and said substrate holder, said thermal energy source providing additional thermal energy to assist in evaporation of the solid or liquid starting materials and preventing unwanted deposition of the evaporated materials onto the walls of the reaction chamber.

* * * * *